(12) United States Patent
Ellersick (10) Patent No.: US 8,081,018 B2
(45) Date of Patent: Dec. 20, 2011

(54) LOW POWER RADIO FREQUENCY DIVIDER

(75) Inventor: William Frederick Ellersick, Sudbury, MA (US)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 12/195,733

(22) Filed: Aug. 21, 2008

(65) Prior Publication Data

US 2010/0046693 A1 Feb. 25, 2010

(51) Int. Cl.
  *H03B 19/00* (2006.01)
(52) U.S. Cl. .......................................... 327/117; 377/47
(58) Field of Classification Search .................. 327/115, 327/117, 118, 150, 159; 377/47, 48
  See application file for complete search history.

(56) References Cited

U.S. PATENT DOCUMENTS

| | | | | |
|---|---|---|---|---|
| 4,316,151 A | * | 2/1982 | Ooms | 331/1 A |
| 5,907,589 A | * | 5/1999 | Koifman et al. | 377/47 |
| 6,750,686 B2 | * | 6/2004 | Wang | 327/115 |
| 6,842,054 B2 | * | 1/2005 | Wang | 327/115 |
| 6,956,405 B2 | * | 10/2005 | Lundberg | 326/95 |
| 7,298,810 B2 | * | 11/2007 | Ke | 377/48 |
| 7,379,522 B2 | * | 5/2008 | Narathong et al. | 377/47 |
| 7,564,276 B2 | * | 7/2009 | Narathong et al. | 327/117 |
| 7,602,877 B2 | | 10/2009 | Shimada | |
| 2004/0202275 A1 | * | 10/2004 | Wang | 377/47 |
| 2005/0058236 A1 | * | 3/2005 | Ke | 377/49 |
| 2005/0180539 A1 | * | 8/2005 | De Gouy et al. | 377/47 |
| 2008/0042697 A1 | * | 2/2008 | Narathong et al. | 327/115 |
| 2008/0136540 A1 | * | 6/2008 | Li | 331/1 A |
| 2009/0146699 A1 | * | 6/2009 | Casagrande et al. | 327/115 |
| 2009/0213980 A1 | * | 8/2009 | Ding et al. | 377/48 |

OTHER PUBLICATIONS

Vaucher, Cicero S. et al, "A Family of Low-Power Truly Modular Programmable Dividers in Standard 0.35-μm CMOS Technology", IEEE Journal of Solid-State Circuits, Jul. 2000, pp. 1039-1045, vol. 35, No. 7.

International Search Report & Written Opinion—PCT/US2009/054679—International Search Authority, European Patent Office, Dec. 1, 2009.

Sleiman Bou Sleiman et al: "Wide-division-range high-speed fully programmable frequency divider" Circuits and Systems and Taisa Conference, 2008. NEWCAS-TAISA 2008. 2008 Joint 6th International IEEE Northeast Workshop on, IEEE, Piscataway, NJ, USA, Jun. 22, 2008, pp. 17-20, XP031311995 ISBN: 978-1-4244-2331-6. Sections I-III*; pp. 17-19

* cited by examiner

*Primary Examiner* — Lincoln Donovan
*Assistant Examiner* — William Hernandez
(74) *Attorney, Agent, or Firm* — Jonathan T. Velasco (57) ABSTRACT

In accordance with the present disclosure, a multi-modulus divider (MMD) circuit configured for operation at high frequencies may include a cascade of multiple divide-by-2-or-3 cells that divides an input clock signal to produce a pulse signal. The MMD circuit may also include a pulse stretching circuit that extends the duration of the pulse signal, thereby outputting an output clock signal. The cascade of divide-by-2-or-3 cells and the pulse stretching circuit may be implemented using full-swing complementary metal-oxide-semiconductor (CMOS) circuits. Each divide-by-2-or-3 cell may be organized so that a critical path of the divide-by-2-or-3 cell comprises a first dynamic flip flop, a second dynamic flip flop, and no more than two logic stages between the first dynamic flip flop and the second dynamic flip flop.

24 Claims, 10 Drawing Sheets

LOW POWER RADIO FREQUENCY DIVIDER

TECHNICAL FIELD

The present disclosure relates generally to electronic circuits. More specifically, the present disclosure relates to a low power radio frequency divider.

BACKGROUND

In some communication systems, a frequency divider produces a lower frequency from an input signal. In one application, for example, a frequency divider is part of a phase-locked loop (PLL), which generates an RF clock signal of a desired frequency utilizing a voltage controlled oscillator (VCO). The RF clock signal is input to the frequency divider, which produces a lower frequency signal. The lower frequency signal is input to a phase-frequency detector along with a reference signal. A charge pump is controlled by the outputs of the phase-frequency detector. The charge pump output is connected to a loop filter to control the frequency of the VCO such that the phase and frequency of the lower frequency signal matches that of the reference signal. This results in an RF clock signal that is higher frequency but still phase-locked to the reference signal.

The reference signal may have a lower frequency than the VCO output signal. The PLL may use a frequency divider so that the VCO output signal frequency is a multiple of the reference signal frequency. Digital logic may control the frequency divider to allow it to divide the VCO output signal by time-varying values. This may effectively allow the VCO to output signals whose frequencies may be non-integer multiples of the reference signal.

This type of PLL may be utilized in a wireless communication device with various transmitters and receivers. The circuitry that handles the radio frequency signals, including the frequency divider, should be adapted to handle high frequencies of operation.

DETAILED DESCRIPTION

A frequency divider circuit may be implemented using full-swing complementary metal-oxide-semiconductor (CMOS) circuits. The use of full-swing CMOS circuits may provide certain advantages over other possible implementations, such as current mode logic (CML) implementations. For example, frequency divider circuits that are implemented using full-swing CMOS circuits may require less power, occupy less space, and generate less noise than frequency divider circuits that are implemented using CML.

However, known frequency dividers that are implemented with full-swing CMOS circuits may not be capable of operating at sufficiently high frequencies for some applications. The present disclosure relates to a frequency divider circuit that is implemented with full-swing CMOS circuits, and that is configured for high frequency operation.

In accordance with the present disclosure, a multi-modulus divider (MMD) circuit configured for operation at high frequencies may include a clock input that receives an input clock signal, and a clock output that outputs a divided version of the input clock signal as an output clock signal. The MMD circuit may be implemented using full-swing complementary metal-oxide-semiconductor (CMOS) circuits. The MMD circuit may be configured for an operating frequency of at least 4 GHz.

In accordance with the present disclosure, a phase-locked loop that generates an output signal of a desired frequency may include a phase frequency detector that generates a control voltage. The phase-locked loop may also include a voltage controlled oscillator that generates a signal whose frequency depends on the control voltage generated by the phase frequency detector. The phase-locked loop may also include a multi-modulus divider circuit (MMD) that divides the signal that is output from the voltage controlled oscillator. The MMD circuit may be implemented using full-swing complementary metal-oxide-semiconductor (CMOS) circuits. The MMD circuit may be configured for an operating frequency of at least 4 GHz.

In accordance with the present disclosure, a multi-modulus divider (MMD) circuit configured for operation at high frequencies may include means for dividing an input clock signal to produce a pulse signal. The MMD circuit may also include means for extending the duration of the pulse signal, thereby outputting an output clock signal. The MMD circuit may be implemented using full-swing complementary metal-oxide-semiconductor (CMOS) circuits. The MMD circuit may be configured for an operating frequency of at least 4 GHz.

In accordance with the present disclosure, a multi-modulus divider (MMD) circuit configured for operation at high frequencies may include a cascade of multiple divide-by-2-or-3 cells that divides an input clock signal to produce a pulse signal. The MMD circuit may also include a pulse stretching circuit that extends the duration of the pulse signal, thereby outputting an output clock signal. The cascade of divide-by-2-or-3 cells and the pulse stretching circuit may be implemented using full-swing complementary metal-oxide-semiconductor (CMOS) circuits. Each divide-by-2-or-3 cell may be organized so that a critical path of the divide-by-2-or-3 cell comprises a first dynamic flip flop, a second dynamic flip flop, and no more than two logic stages between the first dynamic flip flop and the second dynamic flip flop.

In accordance with the present disclosure, a phase-locked loop that generates an output signal of a desired frequency may include a phase frequency detector, charge pump and loop filter that generate a control voltage. The phase-locked loop may also include a voltage controlled oscillator that generates a signal whose frequency depends on the control voltage. The phase-locked loop may also include a multi-modulus divider circuit (MMD) that divides the signal that is output from the voltage controlled oscillator. The MMD circuit may include a cascade of multiple divide-by-2-or-3 cells that divides an input clock signal to produce a pulse signal. The MMD circuit may also include a pulse stretching circuit that extends the duration of the pulse signal, thereby outputting an output clock signal. The cascade of divide-by-2-or-3 cells and the pulse stretching circuit may be implemented using full-swing complementary metal-oxide-semiconductor (CMOS) circuits. Each divide-by-2-or-3 cell may be organized so that a critical path of the divide-by-2-or-3 cell comprises a first dynamic flip flop, a second dynamic flip flop, and no more than two logic stages between the first dynamic flip flop and the second dynamic flip flop.

Figure 1:
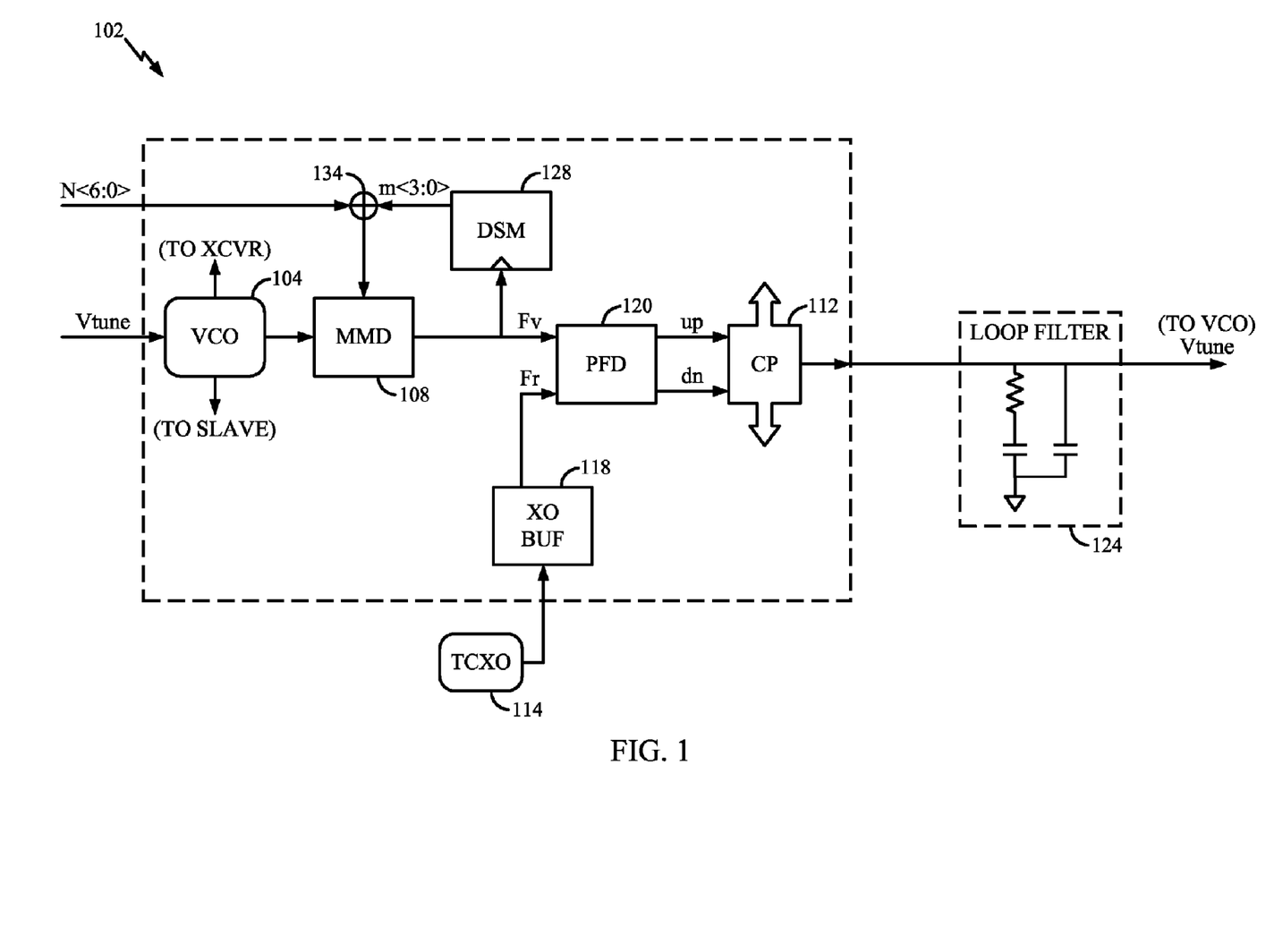
FIG. 1 illustrates a radio frequency (RF) phase-locked loop (PLL) circuit that includes a multi-modulus divider (MMD) circuit that is implemented using full-swing complementary metal-oxide-semiconductor (CMOS) circuits.

FIG. 1 illustrates a radio frequency (RF) phase-locked loop (PLL) circuit 102. The RF PLL circuit 102 includes a voltage controlled oscillator (VCO) 104 that generates an RF clock signal. The RF clock signal may be provided to a transceiver. The RF clock signal is also provided to a frequency divider, which is implemented as a multi-modulus divider (MMD) in the depicted RF PLL circuit 102.

The RF PLL circuit 102 shown in FIG. 1 includes an MMD circuit 108. The MMD circuit 108 is implemented using full-swing complementary metal-oxide-semiconductor (CMOS) circuits. The MMD circuit 108 divides the RF clock signal, producing Fv 110.

The use of the MMD circuit 106 may provide certain advantages over a prior art MMD circuit implemented with CML logic. For example, the MMD circuit 108 may require less power, occupy less space, and generate less noise than the prior art CML MMD circuit.

Advantageously, the MMD circuit 108 is optimized so that it can operate at high clock frequencies (e.g., at least 4 GHz). This is achieved using a combination of optimizations. For example, the logic within the MMD circuit 108 is arranged so as to minimize gate delays for critical paths, i.e., paths that affect the frequency at which the circuit 106 is capable of operating. Another optimization is that dynamic flip flops are used, with no input or output inverters. Another optimization is that some of the transistors that are used are sized so as to maximize the peak operating frequency. Another optimization is that the layout of the MMD circuit 108 is structured to achieve high frequency (i.e., with lots of drain sharing and minimal clock routing). Each of these optimizations will be described in greater detail below.

A crystal oscillator (TCXO) 114 produces a reference signal Fr. The reference signal Fr is buffered by a crystal oscillator buffer (XO BUF) 118.

A phase frequency detector (PFD) 120 compares the phase of Fv and Fr. Based on this comparison, the PFD 120 controls a charge pump (CP) 122 to either source or sink charge into a loop filter 124. The loop filter 124 produces a tuning voltage Vtune. The tuning voltage Vtune is fed back to the VCO 104, and it controls the frequency of the VCO 104.

The factor by which the MMD circuit 108 divides the RF clock signal depends on an integer divide ratio N. A delta-sigma modulator (DSM) 128 makes it possible to divide by non-integer values. The DSM 128 varies the integer divide ratio N in order to maintain a desired average ratio. For example, to divide by 193.5, the divide ratio may be alternated evenly between 193 and 194. As another example, to divide by 193.1, the divide ratio may be alternated so that the MMD circuit 108 divides by 193 for nine cycles, and by 194 for one cycle. A summer 134 adds the integer divide ratio N and a value m provided by the DSM 128 to produce an instantaneous integer divide ratio.

Figure 2:
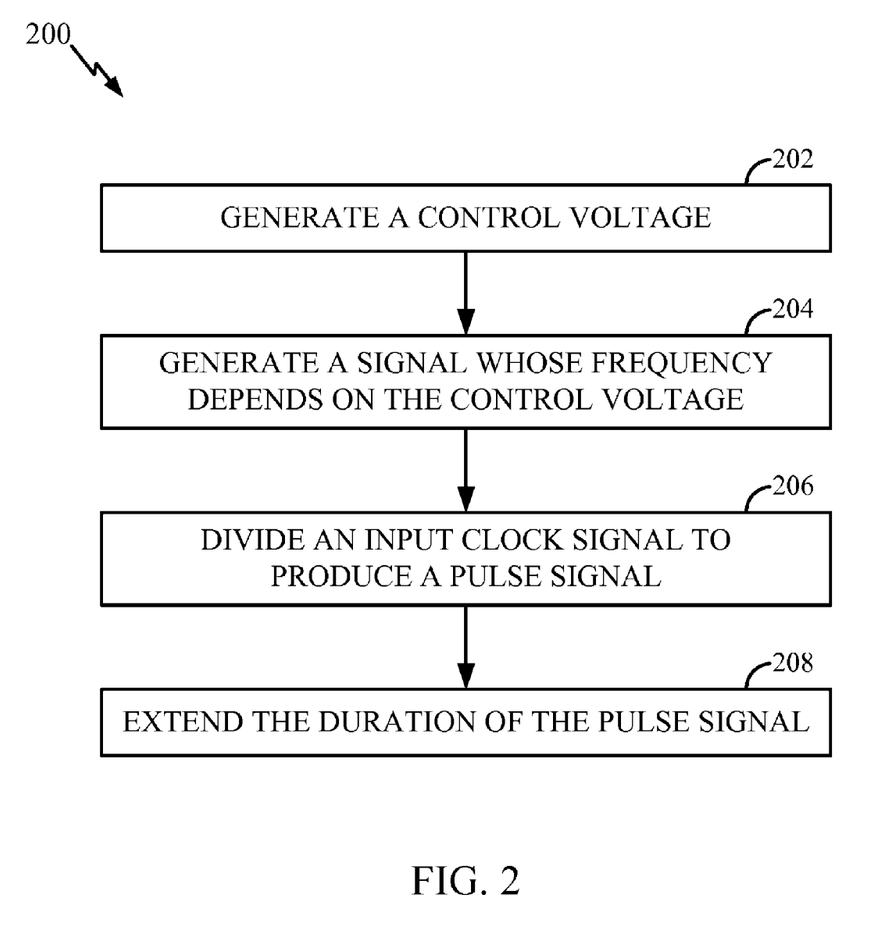
FIG. 2 illustrates a method for using a phase-locked loop circuit.

FIG. 2 illustrates a method 200 for using a phase-locked loop circuit 102. In accordance with the method 200, a phase frequency detector 120, charge pump 112 and loop filter 124 generate 202 a control voltage Vtune. A voltage controlled oscillator 104 generates 204 a signal Fv whose frequency depends on the control voltage Vtune.

An MMD circuit 108 divides the signal Fv that is output from the voltage controlled oscillator 104. The MMD circuit 108 includes a cascade of multiple (e.g., seven) divide-by-2-or-3 cells that operates to divide 206 an input clock signal to produce a pulse signal. The MMD circuit 108 also includes a pulse stretching circuit that operates to extend 208 the duration of the pulse signal, thereby outputting an output clock signal. The operation of the MMD circuit 108, including the cascade of divide-by-2-or-3 cells and the pulse stretching circuit, will be described in greater detail below.

Figure 2A:
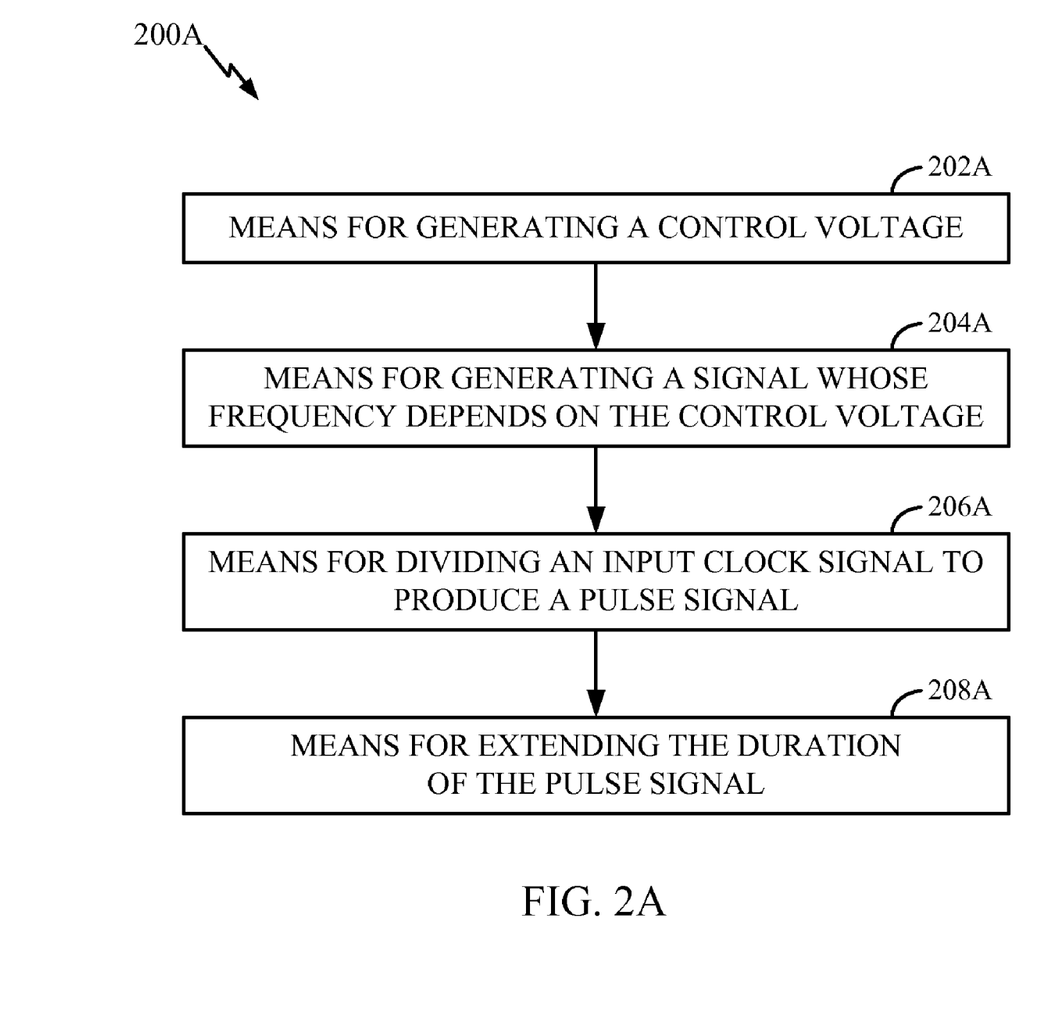
FIG. 2A illustrates means-plus-function blocks corresponding to the method of FIG. 2.

The method 200 of FIG. 2 described above may be performed by various hardware and/or software component(s) and/or module(s) corresponding to the means-plus-function blocks 200A illustrated in FIG. 2A. In other words, blocks 202 through 208 illustrated in FIG. 2 correspond to means-plus-function blocks 202A through 208A illustrated in FIG. 2A.

Figure 3:
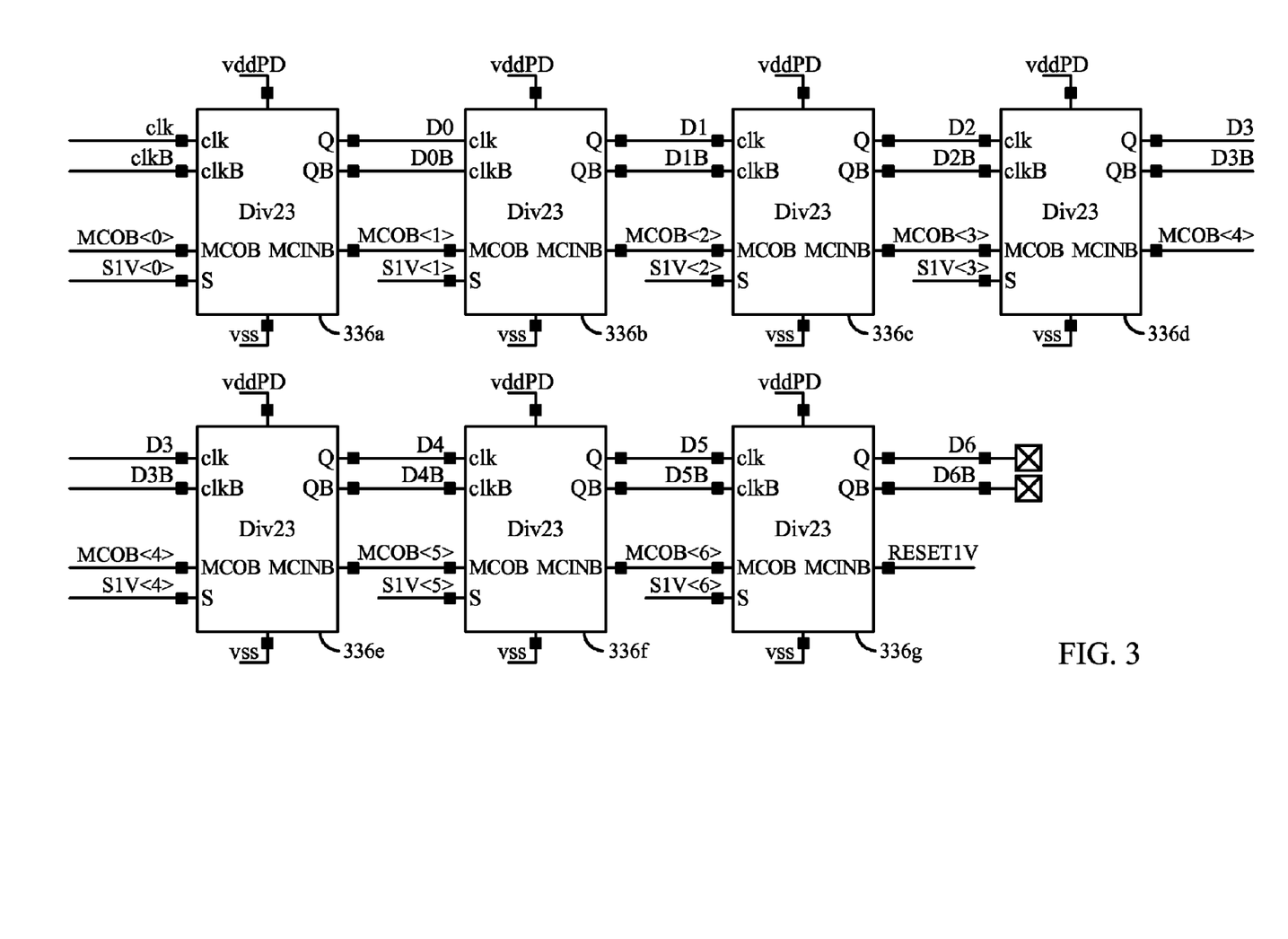
FIG. 3 illustrates a cascade of divide-by-2-or-3 cells in the MMD circuit.

FIG. 3 illustrates the seven cascaded divide-by-2-or-3 (Div23) cells 336 in the MMD circuit 108. Each Div23 cell 336 is capable of dividing by two or dividing by three.

Each Div23 cell 336 includes the following inputs: clk, clkB, S, and MCINB. Each Div23 cell 336 includes the following outputs: Q, QB, and MCOB. These inputs and outputs will be explained in greater detail below.

The signals clk and clkB, which are full-swing complementary clocks, are input to the first Div23 cell 336a. The first Div23 cell 336a divides clk and clkB, thereby producing D0 and D0B, which are then provided as input to the second cell 336b. The second Div23 cell 336b divides D0 and D0B, thereby producing D1 and D1B, which are then provided as input to the third cell 336c. The third cell 336c divides D1 and D1B, thereby producing D2 and D2B, which are then provided as input to the fourth cell 336d. This continues until the seventh cell 336g divides D5 and D5B, thereby producing D6 and D6B.

As indicated above, each Div23 cell 336 includes an MCOB output. An inverted maximum count out signal (MCOB<n>) is output from the MCOB output. When a "maximum count" has been reached for a particular Div23 cell 336, then the MCOB<n> signal output by that Div23 cell 336 goes high. This will be described in greater detail below.

In addition, each Div23 cell 336 includes an S input that receives an S1V<n> signal. The S input for a particular Div23 cell 336 indicates whether that Div23 cell 336 divides by two or divides by three. If the S input is low, the Div23 cell 336 divides by two. If the S input is high, the Div23 cell 336 divides by three.

Each Div23 cell 336 initially divides by two. Once the seventh cell 336f divides by two, it evaluates its S input. If the S input is high, it will divide by three, which means there will be one extra input clock cycle before MCOB<6> goes high (i.e., before it reaches its "maximum count"). On the next clock cycle, on the next rising edge of D4, the sixth cell 336f will then produce an MCOB<5> signal on either the second or third clock that it sees again, depending on whether its S input is high or low. This process continues back up the cascade of Div23 cells 336, until MCOB<0> goes high.

The MCOB<0> signal is a brief pulse signal. The MCOB<0> signal is then provided to a pulse-stretching circuit, which extends the duration of the MCOB<0> signal in order to produce the output clock signal. This will be described in greater detail below.

As discussed above, the MMD circuit 108 is optimized so that it can operate at high clock frequencies. Some of these optimizations relate to the internal organization and layout of each individual Div23 cell 336.

Figure 4:
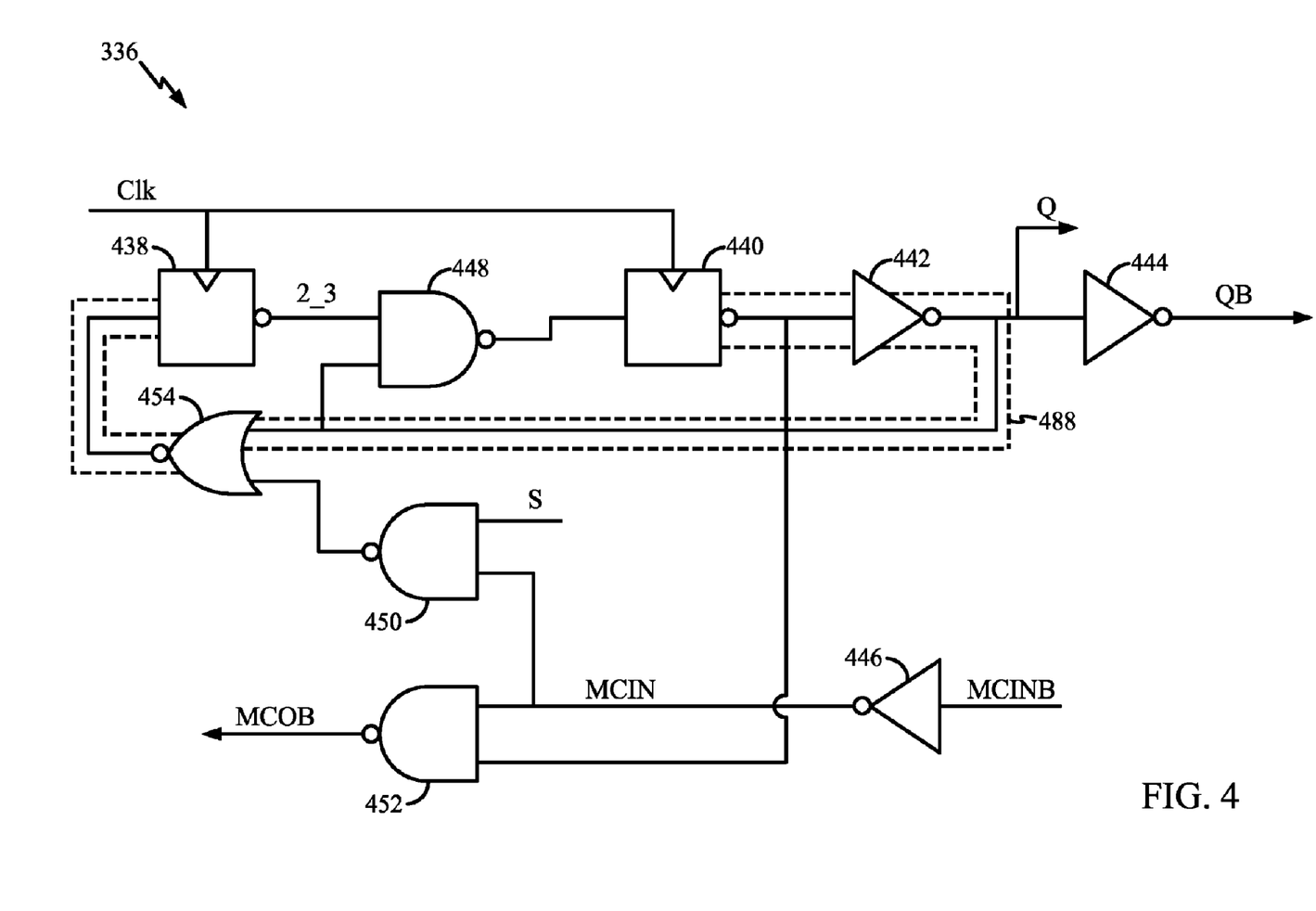
FIG. 4 is a high-level block diagram of a divide-by-2-or-3 cell.

FIG. 4 is a high-level block diagram of a Div23 cell 336. The Div23 cell 336 includes a first dynamic flip flop 438, a second dynamic flip flop 440, a first inverter 442, a second inverter 444, a third inverter 446, a first NAND gate 448, a second NAND gate 450, a third NAND gate 452, and a NOR gate 454.

The Div23 cell 336 includes a clk input. The clk input receives either the complementary input clock signals (i.e., the clk/clkB signals), or the complementary divided clock signals (i.e., D0/D0B, D1/D1B, etc.), depending on where the Div23 cell 336 is positioned in the overall cascade of Div23 cells 336a-g.

The Div23 cell 336 also includes an S input, which as stated above indicates whether the Div23 cell 336 divides by two or divides by three. The Div23 cell 336 also includes a Q output and a QB output, where Q and QB are complementary signals. The Q and QB outputs are divided versions of the complementary clock inputs. For example, if the Div23 cell 336 is the first Div23 cell 336a in the overall cascade, then the complementary clock inputs are clk and clkB, and the complementary divided outputs are D0 and D0B. If the Div23 cell 336 is the second Div23 cell 336b in the overall cascade, then the complementary clock inputs are D0 and D0B, and the complementary divided outputs are D1 and D1B, and so on.

The Div23 cell 336 also includes an inverted maximum count input (MCINB) signal, which is inverted to produce an MCIN signal. The MCINB/MCIN signals indicate whether the downstream Div23 cell 336 has reached its maximum count. For example, if the Div23 cell 336 is the first Div23 cell 336a in the cascade, then the MCINB/MCIN signals would indicate whether the second Div23 cell 336b has reached its maximum count.

The Div23 cell 336 divides by two except when MCINB is low (and MCIN is high), indicating that the downstream Div23 cell 336 has reached its maximum count. At that point, the S input is evaluated. If the S input is high, the Div23 cell 336 waits one more input clock cycle before MCOB goes high.

MCINB is low (and MCIN is high) once per divide cycle. The overall goal of the cascaded Div23 cells 336a-f is to divide by some number N. Consequently, once every N input clock cycles, MCINB goes low, and it stays low. When MCINB is low, then the Div23 cell 336 evaluates S. If S is low, then MCOB goes high. However, if S is high, then the Div23 cell 336 waits one extra input clock cycle before MCOB goes high.

A 2_3 signal is output by the first dynamic flip flop 438 and provided as input to the first NAND gate 448. If MCINB is low and S is high, then the 2_3 signal is low, and Q stays high an extra cycle (i.e., the Div23 cell 336 divides by three). Otherwise, the 2_3 signal is high, and Q toggles.

The path from the second dynamic flip flop 440 to the first dynamic flip flop 438 may be considered to be the critical path 488 of the Div23 cell 336. This critical path 488 is one factor that determines the highest frequency at which the Div23 cell 336 (and as a result the overall MMD circuit 108) is capable of operating correctly.

Advantageously, the logic within the Div23 cell 336 is arranged so as to minimize gate delays for this critical path 488. For example, the first and second dynamic flip flops 438, 440 do not include input or output inverters. Thus, these dynamic flip flops 438, 440 include only two pass gate delays and one inverter delay. This will be described in greater detail below.

In addition, the portion of the critical path 488 that is located between the second dynamic flip flop 440 and the first dynamic flip flop 438 includes only two logic stages, namely the second inverter 442 and the NOR gate 454. Previous implementations of a Div23 cell include at least three logic stages between flip flops. The reduction from three logic stages to two logic stages in the critical path 488 is one factor that helps make it possible for the overall MMD circuit 108 to be able to operate at high frequencies.

It should be noted that the MCIN and S inputs are combined outside of the critical path 488, namely by the second NAND gate 450. This was done in order to minimize the number of logic stages that are included in the critical path 488.

Figure 5:
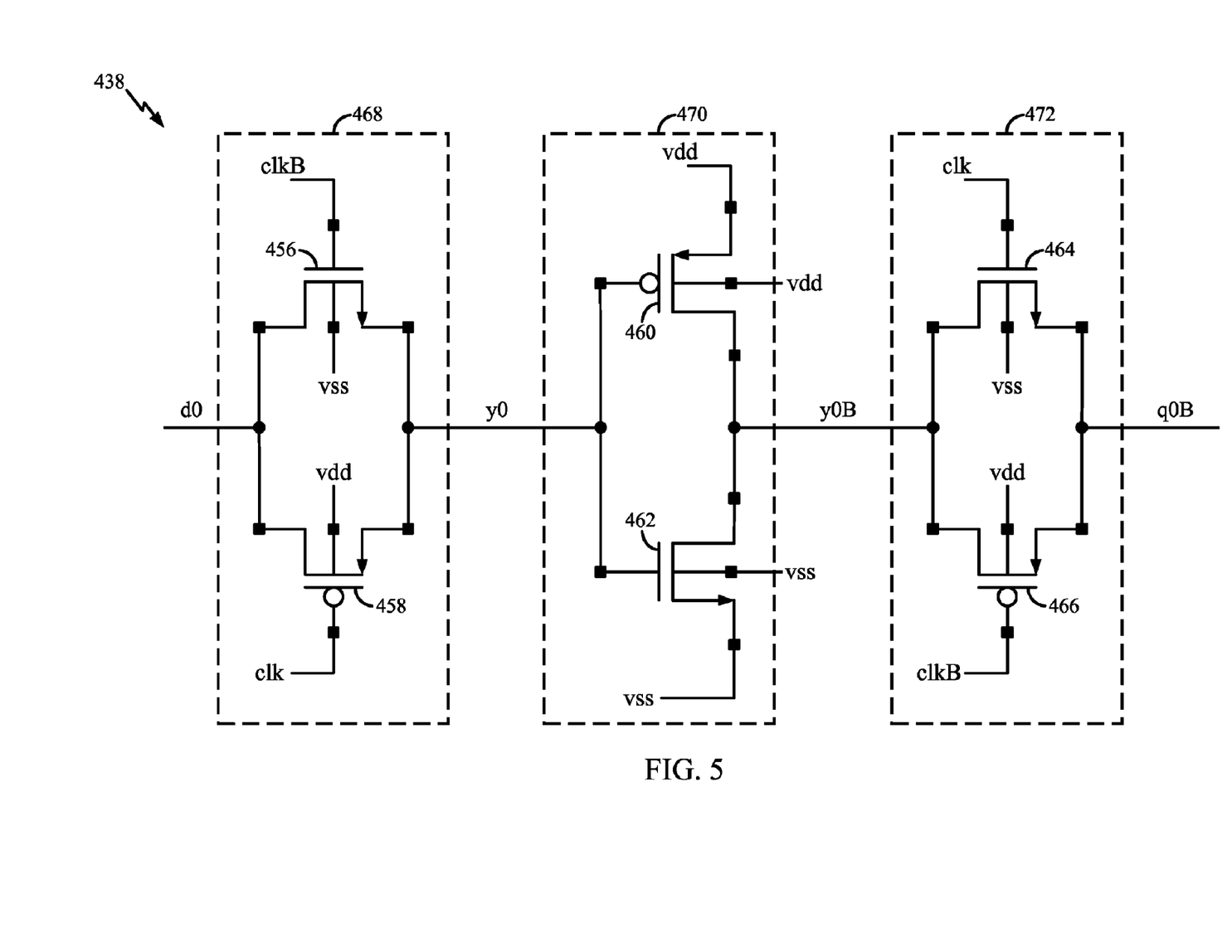
FIG. 5 is a transistor-level diagram of a first dynamic flip flop within the divide-by-2-or-3 cell.

FIG. 5 is a transistor-level diagram of the first dynamic flip flop 438. The first dynamic flip flop 438 includes a first transistor 456, a second transistor 458, a third transistor 460, a fourth transistor 462, a fifth transistor 464, and a sixth transistor 466.

The first transistor 456 and the second transistor 458 form a first pass gate 468. The third transistor 460 and the fourth transistor 462 form an inverter 470. The fifth transistor 464 and the sixth transistor 466 form a second pass gate 472.

Within the first pass gate 468, the clkB signal is connected to the gate of the first transistor 456, and the clk signal is connected to the gate of the second transistor 458. Within the second pass gate 472, the clk signal is connected to the gate of the fifth transistor 464, and the clkB signal is connected to the gate of the sixth transistor 466.

The d0 signal is connected to the drains of the first and second transistors 456, 458. The d0 signal may be considered to be the input to the first dynamic flip flop 438.

The q0B signal is connected to the sources of the fifth and sixth transistors 464, 466. The q0B signal may be considered to be the output of the first dynamic flip flop 438.

When clk is low (and clkB is high), then the first transistor 456 and the second transistor 458 are turned on. Consequently, d0 propagates to y0, which is then inverted by the inverter 470, thereby producing y0B.

When clk rises, the first transistor 456 and the second transistor 458 turn off. Consequently, y0 is in a high impedance state. In other words, y0 is isolated and it remains at the same voltage because of the parasitic capacitance of the first and second transistors 456, 458. Thus, y0 tracks the changes in d0 for half of a clock cycle. When clk goes high, y0 retains the value that was sampled when clk went high.

When clk rises, the fifth transistor 464 and the sixth transistor 466 are turned on, so y0B is driven onto q0B. That continues until clk goes low again. When clk goes low, the fifth transistor 464 and the sixth transistor 466 are turned off, so q0B does not change.

Thus, the first pass gate 468 allows y0 to change only when clk is low. The second pass gate 472 allows q0B to change only when clk is high. Putting these two pass gates 468, 472 together, q0B is only allowed to change at the rising edge of clk. More specifically, y0 changes first while clk is low, which causes y0B to change. However, y0B only changes after clk has been low for some small period of time. Since clk has been low for some small period of time, that means that the fifth transistor 464 and the sixth transistor 466 are turned off. So although y0B changes, q0B does not change at that time because the transistors 464, 466 between them are turned off. When clk goes high, y0B is driven onto q0B. At the instant when clk goes high, q0B can change, and then it does not change again until the next rising edge of clk.

The second dynamic flip flop 440 in the Div23 cell 336 may be configured similarly to the first dynamic flip flop 438 that is shown in FIG. 5. The second dynamic flip flop 440 will be shown in FIG. 6 and described briefly in connection therewith.

Inverters are typically used to buffer the inputs and outputs of flip flops. However, the first dynamic flip flop 438 in the Div23 cell 336 does not include an input inverter or an output inverter. The second dynamic flip flop 440 in the Div23 cell 336 also does not have either an input inverter or an output inverter. Thus, these dynamic flip flops 438, 440 include only two pass gate delays and one inverter delay. By eliminating the input inverters and output inverters, the delays in the critical path 488 are reduced. The elimination of the input inverters and the output inverters is one factor that helps make it possible for the overall MMD circuit 108 to be able to operate at high frequencies.

Figure 6:
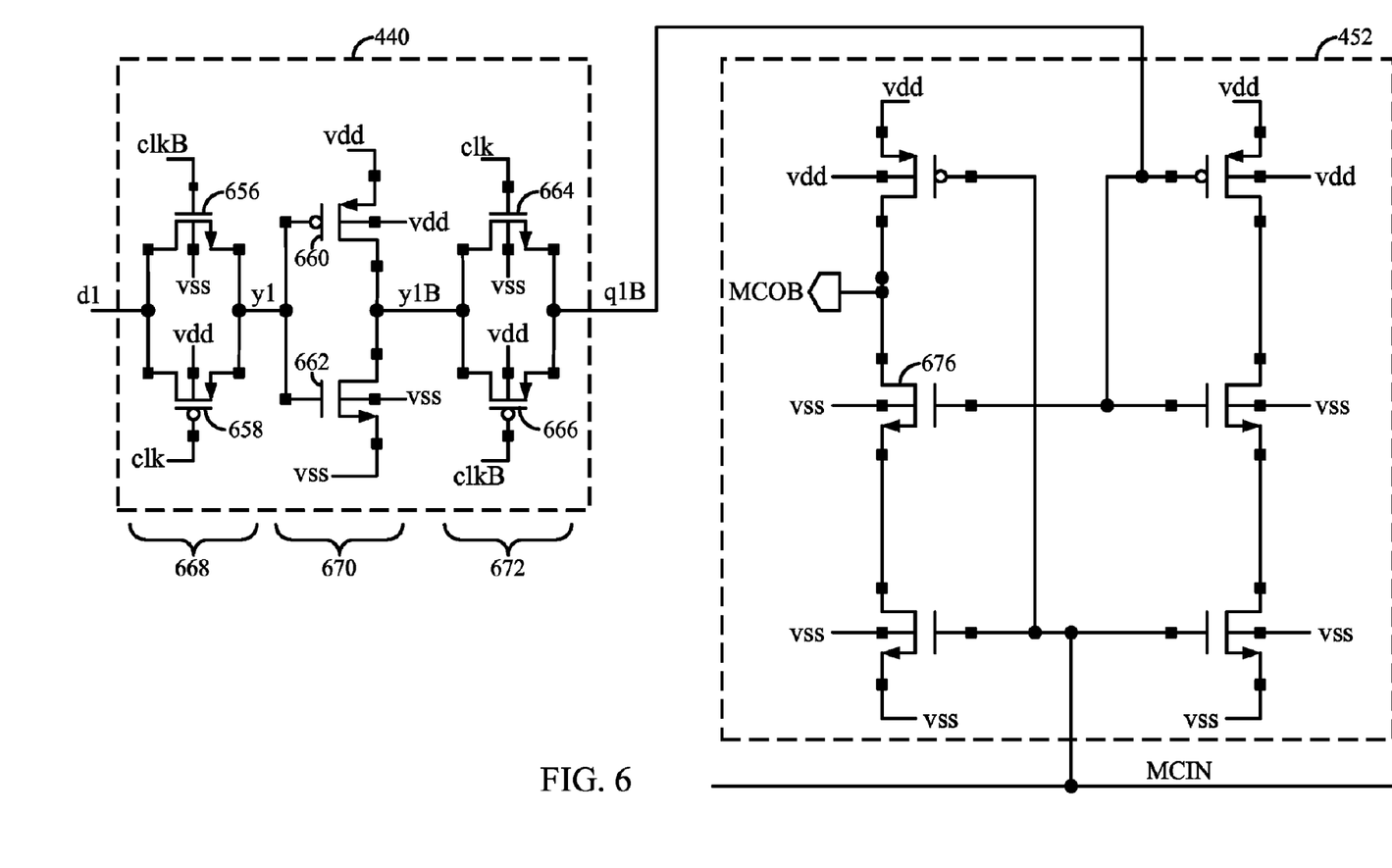
FIG. 6 illustrates a second dynamic flip flop and a NAND gate within the divide-by-2-or-3 cell.

FIG. 6 is a transistor-level diagram that illustrates the second dynamic flip flop 440 and the NAND gate 452 in the Div23 cell 336 of FIG. 4. The second dynamic flip flop 440 includes a first transistor 656, a second transistor 658, a third transistor 660, a fourth transistor 662, a fifth transistor 664, and a sixth transistor 666. The first transistor 656 and the second transistor 658 form a first pass gate 668. The third transistor 660 and the fourth transistor 662 form an inverter 670. The fifth transistor 664 and the sixth transistor 666 form a second pass gate 672.

Within the first pass gate 668, the clkB signal is connected to the gate of the first transistor 656, and the clk signal is connected to the gate of the second transistor 658. Within the second pass gate 672, the clk signal is connected to the gate of the fifth transistor 664, and the clkB signal is connected to the gate of the sixth transistor 666.

The d1 signal is connected to the drains of the first and second transistors 656, 658. The d1 signal may be considered to be the input to the second dynamic flip flop 440.

The q1B signal is connected to the sources of the fifth and sixth transistors 664, 666. The q1B signal may be considered to be the output of the second dynamic flip flop 440.

The second dynamic flip flop 440 operates similarly to the first dynamic flip flop 438 that was described in relation to FIG. 5. The first pass gate 668 allows y1 to change only when clk is low. The second pass gate 672 allows q1B to change only when clk is high. Putting these two pass gates 668, 672 together, q1B is only allowed to change at the rising edge of clk.

As indicated above, the logic within the MMD circuit 108 is optimized so as to minimize gate delays for critical paths. One of these optimizations is that there is a fast path from the rising edge of the input clock signal (clk) to the rising edge of the output clock signal (FvC1V). This helps to minimize supply-induced jitter (i.e., the extent to which variations in the noise on the power supply affects the timing of the output clock). The fast path from the rising edge of the input clock to the rising edge of the output clock consists of a fast path from the rising edge of the input clock to MCOB<0>, and a fast path from MCOB<0> to the rising edge of FvC1V.

The fast path from the rising edge of clk to MCOB<0> is shown in FIG. 6. As indicated above, when clk goes high, q1B can change. This is because the transistors 664, 666 turn on when clk goes high, allowing y1B to propagate to q1B. The q1B signal is connected to the gate of a transistor 676 within the NAND gate 452. The MCOB signal is taken from the drain of this transistor 676. Therefore, there is just one gate delay (i.e., the transistor 676 in the NAND gate 452) from the rising edge of the input clock to MCOB<0>. The fast path from the rising edge of clk to MCOB<0> is one factor that helps to minimize supply-induced jitter, which may improve the overall performance of the MMD circuit 108 while it operates at high frequencies.

Figure 7:
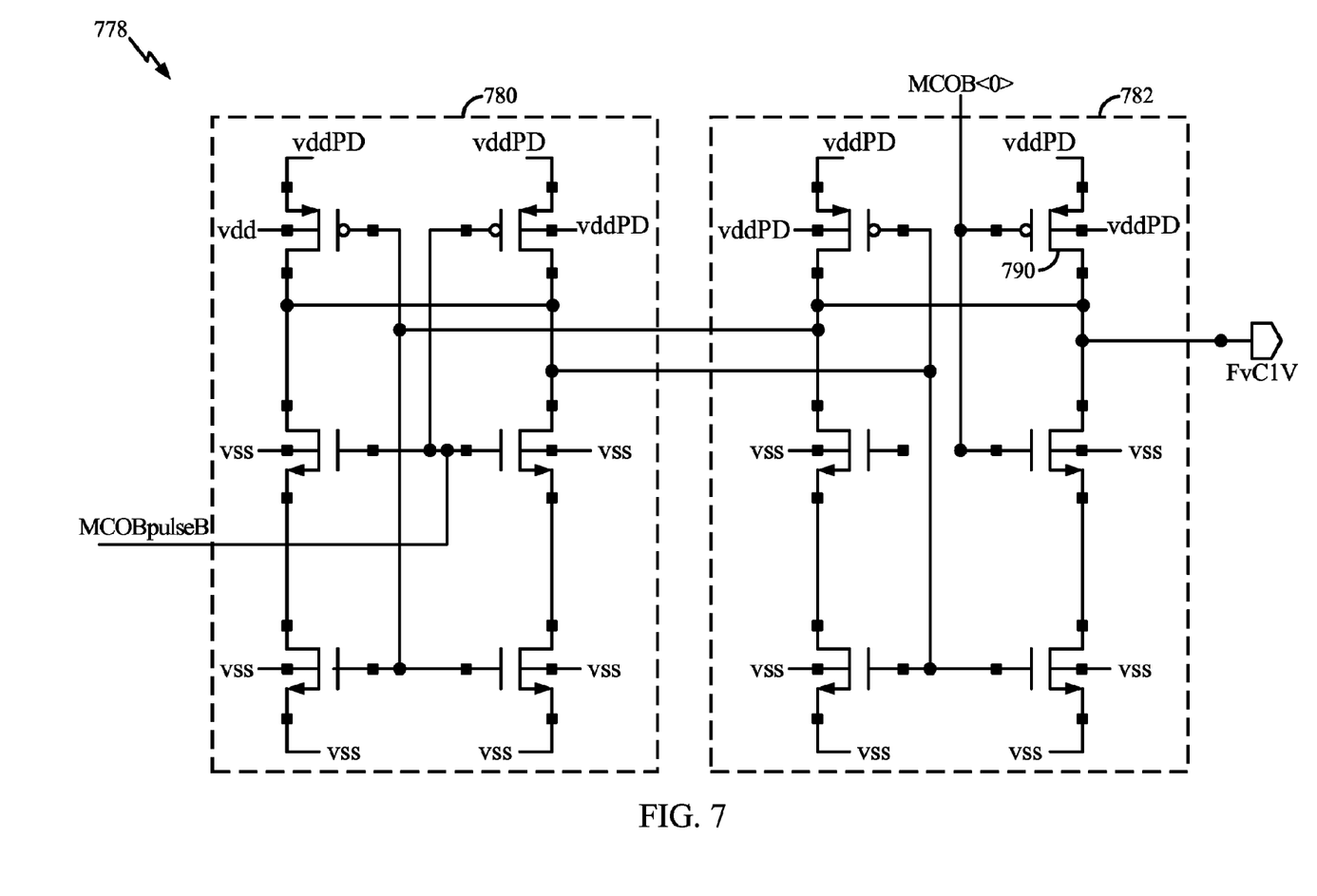
FIG. 7 is a transistor-level diagram that illustrates a pulse-stretching circuit within the MMD circuit.

As indicated above, the MCOB<0> signal is a brief pulse signal. The MCOB<0> signal is provided to a pulse-stretching circuit, which extends the duration of the MCOB<0> signal in order to produce the output clock signal FvC1V. FIG. 7 is a transistor-level diagram that illustrates the pulse-stretching circuit 778, which is implemented as an RS-latch 778.

The RS-latch 778 includes a first NAND gate 780 and a second NAND gate 782. The MCOB<0> signal is input to the second NAND gate 782. A signal called MCOBpulseB is input to the first NAND gate 780. The FvC1V signal is output by the second NAND gate 782.

The outputs of the first and second NAND gates 780, 782 are cross-coupled. Thus, the two NAND gates 780, 782 form an RS-latch 778 that has its output go high whenever one input goes low. In particular, when MCOB<0> goes low, then the output FvC1V goes high.

The MCOBpulseB signal is a reset signal. It resets the RS-latch 778 after some percentage (e.g., 20%) of the total clock cycle time.

As indicated above, the RS-latch 778 may be thought of as a pulse-stretching circuit. MCOB<0> is a very fast pulse. It is only high for one RF clock cycle. The RS-latch 778 receives MCOB<0> as input, and it outputs a signal (FvC1V) that stays high for some percentage of a much lower frequency (e.g., 40 MHz) clock cycle. In other words, the brief pulse MCOB<0> is used to set the RS-latch 778. It stays set for quite a few clock cycles until the reset signal MCO6pulseB goes low, and that resets the RS-latch 778.

As indicated above, the logic within the MMD circuit 108 is optimized so as to minimize gate delays for critical paths. One of these optimizations is that there is a fast path from the rising edge of the input clock signal (clk) to the rising edge of the output clock signal (FvC1V). This helps to minimize supply-induced jitter. The fast path from the rising edge of the input clock to the rising edge of the output clock consists of a fast path from the rising edge of the input clock to MCOB<0>, and a fast path from MCOB<0> to the rising edge of FvC1V.

The fast path from MCOB<0> to the rising edge of FvC1V is shown in FIG. 7. In particular, there is just one gate delay (the transistor 790 in the NAND gate 782) between MCOB<0> and the rising edge of FvC1V.

Thus, there are only two gate delays from the rising edge of the input clock to the rising edge of FvC1V. As discussed above, there is one gate delay (i.e., the transistor 676 in the NAND gate 452) from the rising edge of the input clock to MCOB<0>. Then, as just mentioned, there is just one gate delay (the transistor 790 in the NAND gate 782) between MCOB<0> and the rising edge of FvC1V. The fast path from the rising edge of clk to the rising edge of FvC1V is one factor that helps to minimize supply-induced jitter, which may improve the overall performance of the MMD circuit 108 while it operates at high frequencies.

As indicated above, the MMD circuit 108 is optimized so that it can operate at high clock frequencies. Several of these optimizations have been discussed previously. Another optimization is that some of the transistors that are used in the MMD circuit 108 are sized so as to maximize the peak operating frequency.

Figure 8:
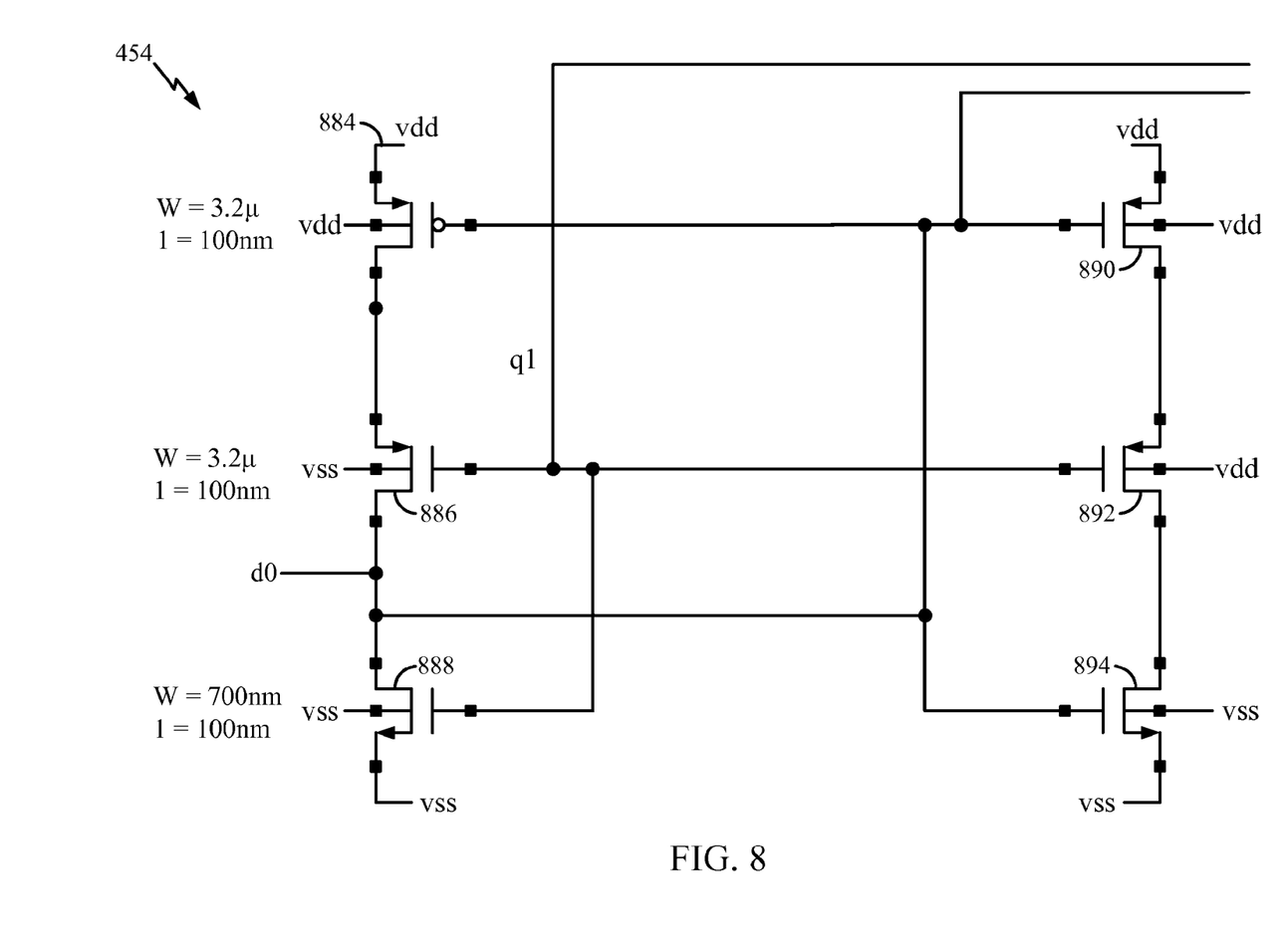
FIG. 8 illustrates an example of an optimization within the MMD circuit that is related to transistor sizing.

FIG. 8 illustrates an example of an optimization that is related to transistor sizing. In particular, FIG. 8 illustrates the NOR gate 454 in the Div23 cell 336. The NOR gate 454 includes a first transistor 884, a second transistor 886, a third transistor 888, a fourth transistor 890, a fifth transistor 892, and a sixth transistor 894. The q1 signal is input to the NOR gate 454.

Both the first transistor 884 and the second transistor 886 have a width of 3.2μ. The third transistor has a width of 700 nm. (All three transistors 884, 886, 888 have a length of 100 nm.) Thus, the ratio between the width of the first and second transistors 884, 886 to the width of the third transistor 888 is approximately 5:1.

The width of the fourth transistor 890 and the fifth transistor 892 is the same as the width of the first transistor 884 and the second transistor 886 (i.e., 3.2μ). The width of the sixth transistor 894 is the same as the width of the third transistor 888 (i.e., 700 nm). Thus, the ratio between the width of the fourth and fifth transistors 890, 892 to the width of the sixth transistor 894 is also approximately 5:1.

This ratio is greater than the corresponding ratio in conventional CMOS implementations of a NOR gate, which is about 4:1. In other words, the first and second transistors 884, 886 and the fourth and fifth transistors 890, 892 are wider than they would be in conventional CMOS implementations of a NOR gate.

Increasing the width of the transistors 884, 886 and the transistors 890, 892 is one example of an optimization that relates to the sizing of the transistors in the MMD circuit 108. Because the speed of a transistor increases with width, the increased transistor width is one factor that helps make it possible for the overall MMD circuit 108 to be able to operate at high frequencies.

Another optimization is that the layout of the MMD circuit 108 is optimized to achieve high frequency (i.e., with lots of drain sharing and minimal clock routing).

Figure 9:
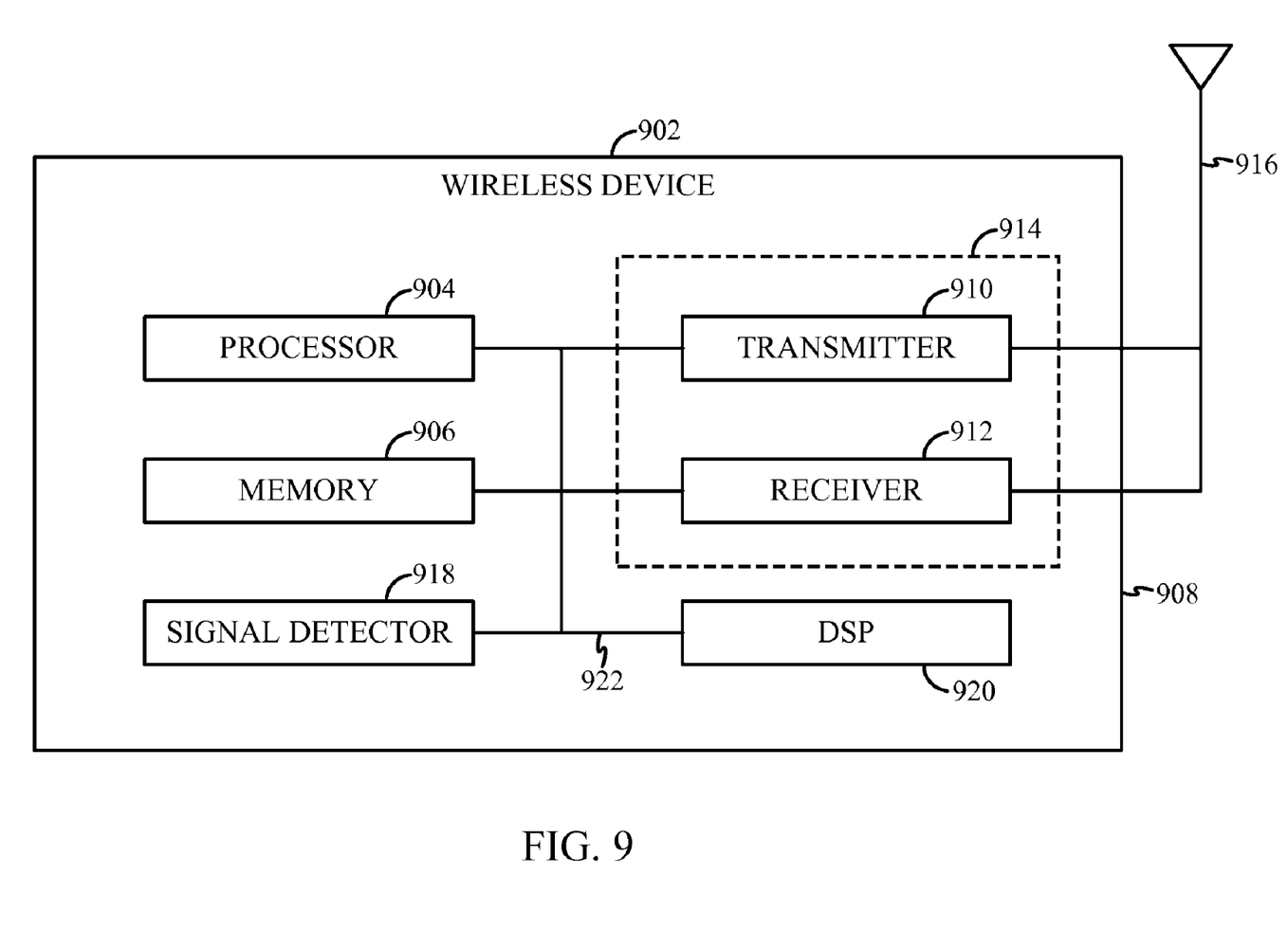
FIG. 9 illustrates various components that may be utilized in a wireless device.

FIG. 9 illustrates various components that may be utilized in a wireless device 902. The wireless device 902 is an example of a device that may utilize the MMD circuit 108 described herein. The wireless device 902 may be a base station or a remote station.

The wireless device 902 may include a processor 904 which controls operation of the wireless device 902. The processor 904 may also be referred to as a central processing unit (CPU). Memory 906, which may include both read-only memory (ROM) and random access memory (RAM), provides instructions and data to the processor 904. A portion of the memory 906 may also include non-volatile random access memory (NVRAM). The processor 904 typically performs logical and arithmetic operations based on program instructions stored within the memory 906. The instructions in the memory 906 may be executable to implement methods described herein.

The wireless device 902 may also include a housing 908 that may include a transmitter 910 and a receiver 912 to allow transmission and reception of data between the wireless device 902 and a remote location. The transmitter 910 and receiver 912 may be combined into a transceiver 914. An antenna 916 may be attached to the housing 908 and electrically coupled to the transceiver 914. The wireless device 902 may also include (not shown) multiple transmitters, multiple receivers, multiple transceivers and/or multiple antenna.

The wireless device 902 may also include a signal detector 918 that may be used to detect and quantify the level of signals received by the transceiver 914. The signal detector 918 may detect such signals as total energy, pilot energy per pseudonoise (PN) chips, power spectral density, and other signals. The wireless device 902 may also include a digital signal processor (DSP) 920 for use in processing signals.

The various components of the wireless device 902 may be coupled together by a bus system 922 which may include a power bus, a control signal bus, and a status signal bus in addition to a data bus. However, for the sake of clarity, the various buses are illustrated in FIG. 9 as the bus system 922.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A multi-modulus divider (MMD) circuit configured for operation at high frequencies, comprising:
    a cascade of multiple divide-by-2-or-3 cells that divides an input clock signal to produce a pulse signal; and
    a pulse stretching circuit that extends the duration of the pulse signal, thereby outputting an output clock signal, wherein the pulse stretching circuit comprises an RS-latch;
    wherein the cascade of divide-by-2-or-3 cells and the pulse stretching circuit are implemented using full-swing complementary metal-oxide-semiconductor (CMOS) circuits;
    wherein the MMD circuit is configured for an operating frequency of at least 4 GHz; and
    wherein the cascade of divide-by-2-or-3 cells and the pulse stretching circuit are organized so that there are no more than two gate delays between a rising edge of the input clock signal a the rising edge of the output clock signal.

2. The MMD circuit of claim 1, wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop.

3. The MMD circuit of claim 2, wherein neither the first dynamic flip flop nor the second dynamic flip flop includes an input inverter or an output inverter.

4. The MMD circuit of claim 2, wherein both of the dynamic flip flops comprise two pass gates and an inverter, and wherein each of the pass gates is configured so that an output is allowed to change only at the rising edge of the input clock signal.

5. The MMD circuit of claim 1, wherein the two gate delays comprise:
    a first gate delay from the rising edge of the input clock signal to the pulse signal; and
    a second gate delay from the pulse signal to the output clock signal.

6. The MMD circuit of claim 2, wherein each divide-by-2-or-3 cell is organized so that multiple inputs are combined outside of the critical path.

7. A phase-locked loop that generates an output signal of a desired frequency, comprising:
    a phase frequency detector, charge pump and loop filter that generate a control voltage;
    a voltage controlled oscillator that generates a signal whose frequency depends on the control voltage; and
    a multi-modulus divider (MMD) circuit that divides the signal that is output from the voltage controlled oscillator, wherein the MMD circuit comprises a cascade of multiple divide-by-2-or-3 cells that divides an input clock signal to produce a pulse signal, and wherein the MMD circuit further comprises a pulse stretching circuit that extends the duration of the pulse signal, thereby outputting an output clock signal, wherein the pulse stretching circuit comprises an RS-latch;

wherein the cascade of divide-by-2-or-3 cells and the pulse stretching circuit are implemented using full-swing complementary metal-oxide-semiconductor (CMOS) circuits;
wherein the MMD circuit is configured for an operating frequency of at least 4 GHz; and
wherein the cascade of divide-by-2-or-3 cells and the pulse stretching circuit are organized so that there are no more than two gate delays between a rising edge of the input clock signal and a rising edge of the output clock signal.

8. The phase-locked loop of claim 7, wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop.

9. The phase-locked loop of claim 8, wherein neither the first dynamic flip flop nor the second dynamic flip flop includes an input inverter or an output inverter.

10. The phase-locked loop of claim 8, wherein both of the dynamic flip flops comprise two pass gates and an inverter, and wherein each of the pass gates is configured so that an output is allowed to change only at the rising edge of the input clock signal.

11. The phase-locked loop of claim 7, wherein the two gate delays comprise:
a first gate delay from the rising edge of the input clock signal to the pulse signal; and
a second gate delay from the pulse signal to the output clock signal.

12. The phase-locked loop of claim 8, wherein each divide-by-2-or-3 cell is organized so that multiple inputs are combined outside of the critical path.

13. A multi-modulus divider (MMD) circuit configured for operation at high frequencies, comprising:
a clock input that receives an input clock signal;
a clock output that outputs a divided version of the input clock signal as an output clock signal;
a cascade of multiple divide-by-2-or-3 cells that divides the input clock signal to produce a pulse signal; and
a pulse stretching circuit that extends the duration of the pulse signal, thereby outputting the output clock signal, wherein the pulse stretching circuit comprises an RS-latch;
wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop;
wherein the MMD circuit is implemented using full-swing complementary metal-oxide-semiconductor (CMOS) circuits;
wherein the MMD circuit is configured for an operating frequency of at least 4 GHz; and
wherein the cascade of divide-by-2-or-3 cells and the pulse stretching circuit are organized so that there are no more than two gate delays between a rising edge of the input clock signal and a rising edge of the output clock signal.

14. The MMD circuit of claim 13, wherein neither the first dynamic flip flop nor the second dynamic flip flop includes an input inverter or an output inverter.

15. The MMD circuit of claim 13, wherein both of the dynamic flip flops comprise two pass gates and an inverter, and wherein each of the pass gates is configured so that an output is allowed to change only at the rising edge of the input clock signal.

16. A phase-locked loop that generates an output signal of a desired frequency, comprising:

a phase frequency detector that generates a control voltage;
a voltage controlled oscillator that generates a signal whose frequency depends on the control voltage generated by the phase frequency detector;
a multi-modulus divider circuit (MMD) that divides the signal that is output from the voltage controlled oscillator;
a cascade of multiple divide-by-2-or-3 cells that divides an input clock signal to produce a pulse signal; and
a pulse stretching circuit that extends the duration of the pulse signal, thereby outputting an output clock signal, wherein the pulse stretching circuit comprises an RS-latch;
wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop;
wherein the MMD circuit is implemented using full-swing complementary metal-oxide-semiconductor (CMOS) circuits;
wherein the MMD circuit is configured for an operating frequency of at least 4 GHz; and
wherein the cascade of divide-by-2-or-3 cells and the pulse stretching circuit are organized so that there are no more than two gate delays between a rising edge of the input clock signal and a rising edge of the output clock signal.

17. The MMD circuit of claim 16, wherein neither the first dynamic flip flop nor the second dynamic flip flop includes an input inverter or an output inverter.

18. The MMD circuit of claim 16, wherein both of the dynamic flip flops comprise two pass gates and an inverter, and wherein each of the pass gates is configured so that an output is allowed to change only at the rising edge of the input clock signal.

19. A method for using a multi-modulus divider (MMD) circuit configured for operation at high frequencies, comprising:
a cascade of multiple divide-by-2-or-3 cells dividing an input clock signal to produce a pulse signal; and
a pulse stretching circuit extending the duration of the pulse signal, thereby outputting an output clock signal, wherein the pulse stretching circuit comprises an RS-latch;
wherein the cascade of divide-by-2-or-3 cells and the pulse stretching circuit are implemented using full-swing complementary metal-oxide-semiconductor (CMOS) circuits;
wherein the MMD circuit is configured for an operating frequency of at least 4 GHz; and
wherein the cascade of divide-by-2-or-3 cells and the pulse stretching circuit are organized so that there are no more than two gate delays between a rising edge of the input clock signal and a rising edge of the output clock signal.

20. The method of claim 19, wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop.

21. The method of claim 20, wherein neither the first dynamic flip flop nor the second dynamic flip flop includes an input inverter or an output inverter.

22. The method of claim 20, wherein both of the dynamic flip flops comprise two pass gates and an inverter, and wherein each of the pass gates is configured so that an output is allowed to change only at the rising edge of the input clock signal.

23. A multi-modulus divider (MMD) circuit configured for operation at high frequencies, comprising:
- means for dividing an input clock signal to produce a pulse signal; and
- means for extending the duration of the pulse signal, thereby outputting an output clock signal, wherein the means for extending the duration of the pulse signal comprises an RS-latch;
- wherein the MMD circuit is implemented using full-swing complementary metal-oxide-semiconductor (CMOS) circuits;
- wherein the MMD circuit is configured for an operating frequency of at least 4 GHz; and
- wherein the means for dividing an input clock signal and the means for extending the duration of the pulse signal are organized so that there are no more than two gate delays between a rising edge of the input clock signal and a rising edge of the output clock signal.

24. The MMD circuit of claim 23, wherein the means for dividing the input clock signal to produce the pulse signal comprises a cascade of multiple divide-by-2-or-3 cells, and wherein each divide-by-2-or-3 cell is organized so that a critical path of the divide-by-2-or-3 cell comprises a first dynamic flip flop, a second dynamic flip flop, and no more than two logic stages between the first dynamic flip flop and the second dynamic flip flop.

* * * * *